United States Patent
Haba

(10) Patent No.: US 6,820,330 B1
(45) Date of Patent: Nov. 23, 2004

(54) METHOD FOR FORMING A MULTI-LAYER CIRCUIT ASSEMBLY

(75) Inventor: Belgacem Haba, Cupertino, CA (US)

(73) Assignee: Tessera, Inc., San Jose, CA (US)

(*) Notice: Subject to any disclaimer, the term of this patent is extended or adjusted under 35 U.S.C. 154(b) by 76 days.

(21) Appl. No.: 09/602,951

(22) Filed: Jun. 23, 2000

Related U.S. Application Data

(63) Continuation of application No. 08/987,521, filed on Dec. 9, 1997.
(60) Provisional application No. 60/032,967, filed on Dec. 13, 1996.

(51) Int. Cl.$^7$ .............................................. H01K 3/10
(52) U.S. Cl. ............................ 29/852; 29/846; 29/825; 427/97; 427/99
(58) Field of Search ........................ 29/852, 846, 825; 427/97, 99

(56) References Cited

U.S. PATENT DOCUMENTS

| | | | |
|---|---|---|---|
| 3,739,469 A | | 6/1973 | Dougherty, Jr. ............... 29/625 |
| 3,795,037 A | | 3/1974 | Luttmer ........................ 29/628 |
| 3,862,790 A | | 1/1975 | Davies et al. ........... 339/17 LM |
| 4,249,302 A | | 2/1981 | Crepeau ....................... 29/830 |
| 4,528,072 A | | 7/1985 | Kurosawa et al. ............. 204/15 |
| 4,685,210 A | | 8/1987 | King et al. ................... 29/830 |
| 4,788,766 A | | 12/1988 | Burger et al. ................. 29/830 |
| 4,793,814 A | | 12/1988 | Zifcak et al. ................. 439/66 |
| 4,834,835 A | * | 5/1989 | Cziep et al. .................... 216/7 |
| 4,902,606 A | | 2/1990 | Patraw ....................... 430/314 |
| 5,153,986 A | * | 10/1992 | Brauer et al. ................. 29/846 |
| 5,153,987 A | * | 10/1992 | Takahashi et al. ............ 29/852 |
| 5,160,579 A | * | 11/1992 | Larson ........................ 216/18 |
| 5,224,265 A | | 7/1993 | Dux et al. .................... 29/852 |
| 5,228,861 A | | 7/1993 | Grabbe ........................ 439/66 |
| 5,232,548 A | * | 8/1993 | Ehrenberg et al. ............ 216/18 |
| 5,282,312 A | * | 2/1994 | DiStefano et al. ............ 29/830 |
| 5,418,689 A | * | 5/1995 | Alpaugh et al. ............... 29/850 |
| 5,537,740 A | * | 7/1996 | Shirai et al. ................... 29/852 |
| 5,558,928 A | | 9/1996 | DiStefano et al. ........... 428/209 |
| 5,583,321 A | | 12/1996 | DiStefano et al. ........... 174/264 |
| 5,590,460 A | | 1/1997 | DiStefano et al. ............. 29/830 |
| 5,659,951 A | * | 8/1997 | Gall et al. ..................... 29/830 |
| 5,666,722 A | * | 9/1997 | Tamm et al. .................. 29/852 |
| 5,680,701 A | * | 10/1997 | Sippel .......................... 29/852 |
| 6,098,282 A | * | 8/2000 | Frankeny et al. .............. 29/852 |
| 6,378,201 B1 | * | 4/2002 | Tsukada et al. ................ 29/852 |

FOREIGN PATENT DOCUMENTS

| | | | | |
|---|---|---|---|---|
| JP | 40-600 6041 | | 1/1994 | ................... 29/853 |
| JP | 40-6006041 | * | 1/1994 | ................... 29/853 |

* cited by examiner

*Primary Examiner*—Richard Chang
(74) *Attorney, Agent, or Firm*—Lerner, David, Littenberg Krumholz & Mentlik, LLP

(57) ABSTRACT

A method of making a multi-layer circuit assembly includes providing a core structure including an inner dielectric element having first and second metal layers on opposite surfaces thereof, forming one or more through vias extending through the metal layers and the inner dielectric element and coating the metal layers and the through vias with a dielectric material to form a coated structure having first and second outer dielectric layers overlying the first and second metal layers respectively and dielectric material lining the through vias. An outer metal layer is then provided over the first and second outer dielectric layers. The coated through vias are then metallized to form metallic via lines which connect the outer metal layers and which are insulated from the first and second metal layers. The outer metal layers are then selectively patterned to form first signal lines overlying the first metal layer and second signal lines overlying the second metal layer. In certain embodiments, blind vias may be formed through the outer dielectric layers to expose one or more regions of the first and second metal layers. The blind vias are then metallized so that at least some of the signal lines are connected to the first and second metal layers.

26 Claims, 3 Drawing Sheets

METHOD FOR FORMING A MULTI-LAYER CIRCUIT ASSEMBLY

CROSS REFERENCE TO RELATED APPLICATIONS

The present application is a continuation of U.S. patent application Ser. No. 08/987,521 filed Dec. 9, 1997, which claims benefit of U.S. Provisional Patent Application Serial No. 60/032,967 filed Dec. 13, 1996, the disclosure of which is incorporated by reference herein.

FIELD OF THE INVENTION

The present invention relates to the field of electrical circuitry, and more particularly relates to the fabrication of individual panels with multiple layers.

BACKGROUND OF THE INVENTION

There continues to be an ever increasing need for multi-layer electronic assemblies which provide high density, complex interconnections for electrical components. Methods for forming multilayer electronic assemblies are taught in Dux et al., U.S. Pat. No. 5,224,265 and Ehrenberg et al. U.S. Pat. No. 5,232,548. The '265 patent discloses a high-density, multi-layer thin film structure and process for making a multi-layer structure wherein multiple individually testable sub-units are fabricated in parallel, pre-tested for operational performance, and joined together to form a three dimensional wiring matrix.

Commonly assigned U.S. Pat. No. 5,590,460 to DiStefano et al., the disclosure of which is incorporated by reference herein, teaches a process for making a multi-layered assembly including providing a sheet of a dielectric material having a top and a bottom surface. Layers of a temporary layer susceptible to etching are coated on the top and bottom surfaces of the dielectric sheet, respectively. Photoresist layers are then applied over the top and bottom temporary layers and are photographically exposed to develop openings which are perpendicular to the external surfaces of the assembly. The assembly is then expressed to an etchant to form aligned apertures in the top and bottom temporary layers. After formation of the holes, an electrically conductive structural material such as a metal is deposited within each hole and within the apertures in the top and bottom temporary layers. A structural material is then applied as a continuous layer covering the peripheral surfaces of the holes in the sheet and also covering the peripheral walls of the apertures in the temporary layers.

Despite these and other efforts in the art, there are needs for still further improvement.

SUMMARY OF THE INVENTION

According to one embodiment of the invention, a method of making a multi-layer circuit assembly includes providing a core structure having an inner dielectric element with first and second metal layers on opposite surfaces thereof. The dielectric element, such as a polyimide material, is preferably between about 25 to 50 microns thick. The first and second metal layers may comprise a highly conductive material such as copper and each metal layer is generally about are 1 to 18 thick. In one embodiment, the first metal layer on top of the dielectric element could serve as a ground plane and the second metal layer on the bottom surface of the dielectric element could serve as a power plane. The first and second metal layers will also act as a backbone for the final assembly to provide rigidity thereto. The specific composition of the first and second metal layers may vary depending upon the specific application for which the final assembly will be used, which in turn will determine the thermal coefficient of expansion and the ultimate dimensional stability of the assembly.

In the next stage of the process, one or more through vias are formed through the metal layers and the inner dielectric element. The through vias may be created by a variety of well know techniques such as punching, laser during or plasma etching. The through vias should extend entirely through the first metal layer, the dielectric element and the second metal layer. The exact location of the through vias may vary depending upon the specific requirements of the final assembly. In one preferred embodiment, the through vias may be formed by first etching the metal layers to form aligned holes therein, aligning a laser with the aligned holes and laser drilling through the dielectric element. In another embodiment, a YAG laser may be used. In a first drilling step, the first and second metal layers are drilled while the YAG laser is on high power. In a second drilling step, the dielectric element is drilled while the YAG laser is on low power. As will be discussed in more detail below, although laser drilling may be slightly more costly than plasma etching, laser drilling provides for better alignment of the holes in the metal layers with the holes in the dielectric element. In addition, the side walls formed using a laser are more uniform than those formed with etching techniques.

After the through vias have been formed, the first and second metal layers and the through vias are coated with a dielectric material, such as a polyimide or an epoxy, to form a coated structure having first and second outer dielectric layers. The dielectric material is applied using well known techniques such as dipping, spin coating and plating techniques (e.g. preferably electrophoretic plating). During the coating process, all of the exposed surfaces of the metal layers, including the side walls of the through vias, are covered by the dielectric material. The thickness of the dielectric material coating should be uniform. For example, in certain preferred embodiments, after the coating step, the outer dielectric layers have a uniform thickness of approximately 25 to 75 microns. The exact thickness of the dielectric material is controlled so that the through vias remain open after the coating process. For example, in certain embodiments, the diameter of the through vias is approximately 175 to 200 microns before the coating process and approximately 25 to 150 microns after the coating process.

In the next stage of the process, outer metal layers comprising highly conductive materials such as copper are provided over the first and second outer dielectric layers, respectively. The step of providing the outer metal layers over the first and second outer dielectric layers may include the steps of seeding the exterior surface of the outer dielectric layers, such as by exposure to a liquid seeding process or by sputter deposition. For example, an adhesion promoting layer of a conductive base, such as a graphite seed, may be applied. The seed layer contacts the first and second outer dielectric layers. The outer metal layers are then electroplated over the seed layer as by connecting an electroplating potential source to the first and the second metal layers and immersing the assembly in an electroplating bath with a counter electrode. The outer metal layers may also be provided using electroless plating or sputtering techniques. The outer metal layers substantially conform to the shape of the first and second outer dielectric layers. Each outer metal layer preferably has a thickness of approximately 1 to 18 microns and most preferably a thickness of approximately 1 to 6 microns; however, the exact thickness of the outer metal layers will depend upon the particular application for which the assembly will be used. Finally, the coated through vias are metallized to form metallic via liners which are connected to the outer metal layers and which are insulated from the first and second metal layers.

In other preferred embodiments, the adhesion between the outer metal layers and the first and second outer dielectric layers may be enhanced by providing a tie coat including nickel and chrome. In these embodiments, the nickellchrome tie coat is provided directly over the outer dielectric layers and then a seed layer, such as copper, is provided over the tie coat. Finally another layer of copper, which is thicker than the seed layer, is provided over the seed layer.

In the next stage of the process signal lines are formed by selectively patterning the outer metal layers to form first signal lines overlying, the first metal layer and second signal lines overlying the second metal layer. The selectively patterning step includes the step of selectively removing portions of the outer metal layers such as by selectively etching the outer metal layers. In one embodiment, a photoresist layer is provided over the outer metal layers and the layers are then subjected to an etching process to pattern the signal lines therein. In other embodiments the selectively patterning step may include the step of selectively depositing the outer metal layers. The first signal lines are substantially parallel to one another and substantially perpendicular to the second signal lines. In turn, the second signal lines are substantially parallel to one another. After the signal lines have been formed, the assembly may be used to electrically connect circuit elements on the same side of the assembly or on opposite sides thereof. The above-described methods provide economical processes of making a multi-layer circuit assembly. The same techniques may be used with a different number of layers to provide a circuit assembly having numerous layers whereby several of the structures described above can be laminated together. For example, the lamination techniques disclosed in U.S. Pat. No. 5,282,312, the disclosure of which is incorporated herein by reference, may be employed.

In other embodiments, blind via openings may be formed through the outer dielectric layers to expose one or more regions of the first and second metal layers. The blind vias may be formed by placing a mask over the first and second outer dielectric layers and scanning a laser over the mask so that laser light passes through apertures in the mask to cut through the dielectric material. During the laser drilling step, substantially all of the dielectric material is removed from the blind vias; however, a slight residue of dielectric material may remain at the closed ends of one or more of the blind vias adjacent the exposed regions of the first and second metal layers. The residue in the blind vias, which typically has a thickness of less than one micron, may be removed by subjecting the assembly to a plasma etching process. Although it is preferable to remove the residue using a plasma etching process so that all of the blind vias may be simultaneously treated, it is also possible to use a YAG laser to remove the residue. However, the use of a laser to remove the residue may prove time consuming because typically the laser must be aligned with each of the blind via openings. After the blind vias have been formed, one or more regions of the first and second metal layers are exposed and accessible through the blind vias. The blind vias are then metallized so that at least some of the signal lines are connected to the first and second metal layers. The steps of metallizing the through vias and metallizing the blind vias may be performed simultaneously.

In another embodiment of a method of making a multi-layer circuit assembly, the method includes providing an inner dielectric element and first and second metal layers having openings therein on opposite surfaces of the inner dielectric element, whereby each opening in the first metal layer is in substantial alignment with one of the openings in the second metal layer. For example, first and second metal layers having a plurality of apertures therein may be provided and the metal layers may be laminated to opposite surfaces of a dielectric element so that the openings in the first and second metal layers are in substantial alignment. Lamination techniques are disclosed in commonly assigned U.S. Pat. No. 5,583,321, the disclosure of which is incorporated herein by reference The inner dielectric element and the first and second metal layers are then coated with a dielectric material, using the coating processes described above, to thereby form a coated structure having first and second other dielectric layers overlying the first and second metal layers respectively. Next, through vias are formed through the coated structure, whereby each through via is in substantial alignment with the aligned openings in the first and second metal layers. For example, a laser may be aligned with the aligned openings in the metal layers for simultaneously drilling through the outer metal layers and the dielectric element to provide one or more through vias. During the drilling step, it is critical that the diameter of the laser cut be controlled so that the first and second metal layers remain covered by the dielectric material and are not exposed at the side walls of the through vias. In alternative embodiments, the through vias may be formed using the etching or punching techniques described above. After the through vias have been formed, a final multi-layer assembly may be fabricated using the processes described above.

In another embodiment of the present invention, the first and second outer metal layers may be provided over the outer dielectric layers before the blind vias are formed in the outer dielectric layers. The outer metal layers according to this embodiment may be laminated to the outer dielectric layers or may be applied using a plating technique or sputtering technique. The blind vias may then be formed through the outer metal layers and the outer dielectric layers using the various techniques described above in order to expose one or more regions of the first and second metal layers. Next, the blind vias may be metallized so that at least some of the signal lines are connected to the first and second metal layers. The metal in the blind vias may be provided using electroless plating and sputtering techniques.

In other embodiments, additional signal lines may be formed in at least one of the first and second metal layers before the coating step.

For example, signal paths for carrying critical signals may be etched into the first and second metal layers, and the signal paths insulated during the coating with a dielectric material step.

These and other objects, features and advantages of the present invention will be more readily apparent from the detailed description of the preferred embodiments set forth below, taken in conjunction with the accompanying drawings.

DETAILED DESCRIPTION OF PREFERRED EMBODIMENTS

Figure 1:
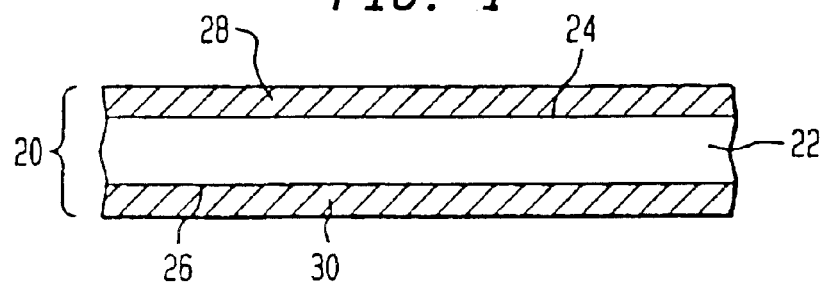
FIG. 1. is a fragmentary diagrammatic sectional view depicting portions of a multi-layer circuit assembly during one step of a fabrication process according to one embodiment of the invention.

A method in accordance with one embodiment of the present invention begins with a core structure 20 including an inner dielectric element 22 having a first or top surface 24 and a second or bottom surface 26. The inner dielectric element 22 includes a material having a relatively high elastic modulus such as a polyimide material. One suitable polyimide material is available under the trade name UPILEX from the Ube Corporation. The dielectric element may also include an epoxy or a FR4 circuit board. The dielectric element is preferably about 25 to 50 microns thick.

A first metal layer 28 is provided over the first surface 24 of the inner dielectric element 22 and a second metal layer 30 is provided over the second or bottom surface 26 of the dielectric element 22. The first and second metal layers 28 and 30 may be assembled with the inner dielectric element 22 using the lamination techniques disclosed in commonly assigned U.S. Pat. No. 5,583,321, the disclosure of which is incorporated herein by reference. The first and second metal layers 28, 30 preferable comprise materials having highly conductive properties such as copper, gold and bronze or alloys or composites thereof; however, the exact composition of the metal layers 28, 30 may vary based upon the particular application for which the multi-layer circuit assembly will be utilized. The composition of the first and second metal layers 28, 30 will determine the coefficient of thermal expansion and- the overall dimensions of the final assembly. Preferably the first and second metal layers 28, 30 are each between approximately 1 to 18 microns thick. In addition, the first and second metal layers will provide rigidity for the final assembly.

Figure 2:
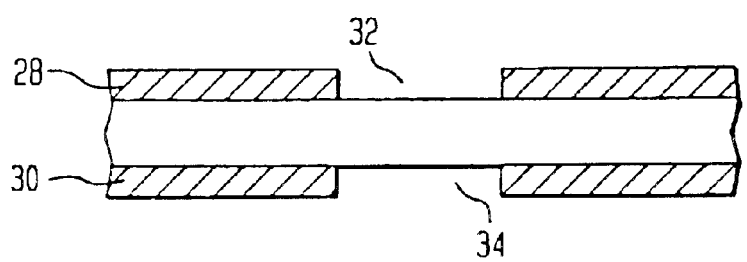
FIGS. 2–8 are views similar to FIG. 1 but depicting the multi-layer circuit assembly during later stages of the same process.

In the next stage of the process, one or more via holes are formed through the first and second metal layers 28, 30 and the inner dielectric element 22 and are hereinafter referred to as "through vias." The exact location of the through vias will depend upon the particular application for which the final circuit assembly is to be utilized. Referring to FIG. 2, during an initial stage of forming the through vias, a plurality of holes are created in the first and second metal layers 28, 30 by well known techniques, such as etching. In other embodiments, the holes in the first and second metal layers 28, 30 are created by techniques such as photo processing, plasma etching, punching and laser drilling. Each hole 32 in the first metal layer 28 is in substantial alignment with one of the holes 34 in the second metal layer 30. After the holes 32 and 34 have been formed, the metal layers 28, 30 serve as a mask and an opening in alignment with the holes 32, 34 is drilled through the inner dielectric element 22 using a laser, such as a $CO_2$ laser.

Figure 3:
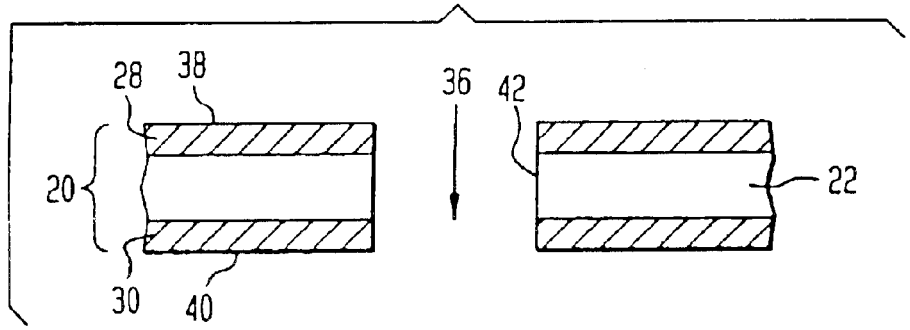

FIG. 3 shows the core structure 20 after one or more through vias 36 have been formed therein. Each through via 36 extends entirely through the metal layers 28, 30 and the inner dielectric element 22, i.e. from the exterior surface 38 of the first metal layer 28 to the exterior surface 40 of the second metal layer 30. The through vias 36 extend in a direction which is substantially perpendicular to horizontal planes (not shown) formed by the first and second surfaces 24, 26 of the dielectric element 22. Each through via 36 includes one or more side walls 42 which define the diameter of the via 36. The above-described process for forming the through vias 36 comprises at least two steps including etching the first and second metal layers 28, 30 and laser drilling the inner dielectric element 22. However, other methods may be used, such as simultaneously punching through the first and second metal layers 28, 30 and the dielectric element 22, or using a YAG laser to drill through the metal layers 28, 30 at high power and through the inner dielectric element 22 while the YAG laser is at low power. Although using a laser to form through vias may prove more costly than certain etching techniques, there are advantages to using a laser drill, such as more accurate alignment of the through vias 36 and formation of uniform side walls 42. In contrast, chemical etching techniques are not effective for controlling the uniformity and configuration of the through via side walls, e.g. the side walls are generally irregular in shape, sloped and/or curved.

Figure 4:
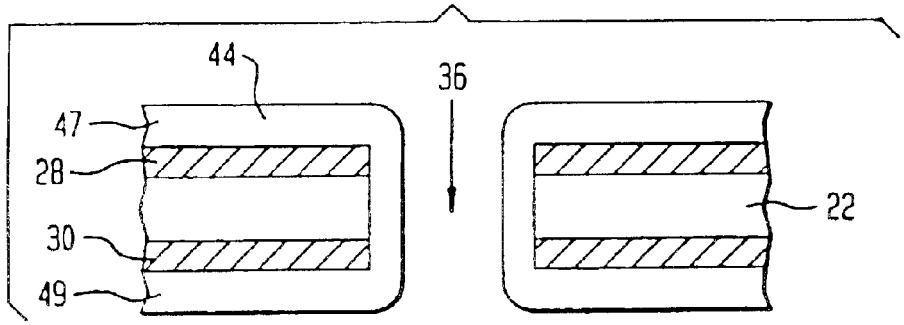

Referring to FIG. 4, in the next stage of the process, the metal layers 28, 30, and the through vias 36 are coated with a dielectric material to form an at least somewhat conformally coated structure having first and second outer dielectric layers 47, 49 which overlie the first and second metal layers 28, 30, respectively. Various techniques may be used for coating the metal layers 28, 30 and the through vias 36 including dipping the structure in a dielectric material solution, spin coating or plating (e.g., as electrophoretic plating). After the coating step, the outer dielectric layers 47, 49 should have a uniform thickness and should not have any voids or pin-holes therein. The outer dielectric layers 47, 49 may be one of any number of different materials such as a photosensitive or a non-sensitive polyimide, epoxy or other dielectric material. As mentioned above, during the coating step the dielectric material also lines the side walls 42 of the through vias. The specific thickness of the dielectric material is controlled so that the through vias 36 remain open and are not clogged after the coating step. For example, before the coating step each through via 36 is preferably between 150 to 250 microns in diameter and after the coating step each through via 36 is preferably between 50 and 150 microns in diameter. When using the electrophoretic plating technique, the amount of dielectric material applied may be controlled by regulating the voltage level and the specific composition of the electrophoretic material.

Figure 5:
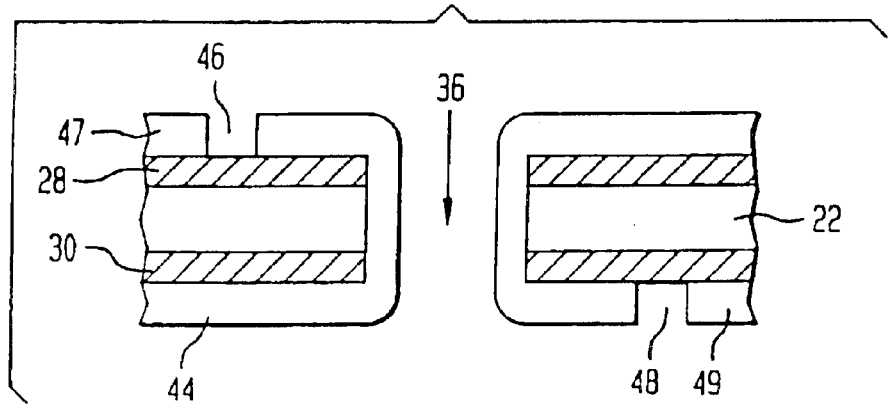

Referring to FIG. 5, in the next stage of the process, blind vias are formed through the outer dielectric layers 47 and 49 to expose one or more regions of the first and second metal layers 28, 30. A first set of blind vias 46 are formed through the first outer dielectric layer 47 to expose portions of the first metal layer 28 and a second set of blind vias 48 are formed through the second outer dielectric layer 49 to expose portions of the second metal layer 30. The blind vias 46, 48 are formed by placing a mask (not shown) over the first and second outer dielectric layers 47, 49 and scanning the dielectric material with a laser. During the scanning step, the laser will pass through openings in the mask to form the blind via openings 46, 48. A slight residue of dielectric material, having a thickness of generally less than about 1 micron, may remain in the closed ends of the blind vias 46, 48. The residue is preferably removed by using a plasma etching technique which simultaneously removes the residue from all of the blind vias 46, 48; however, the residue may also be removed using a laser drilling technique.

Figure 6:
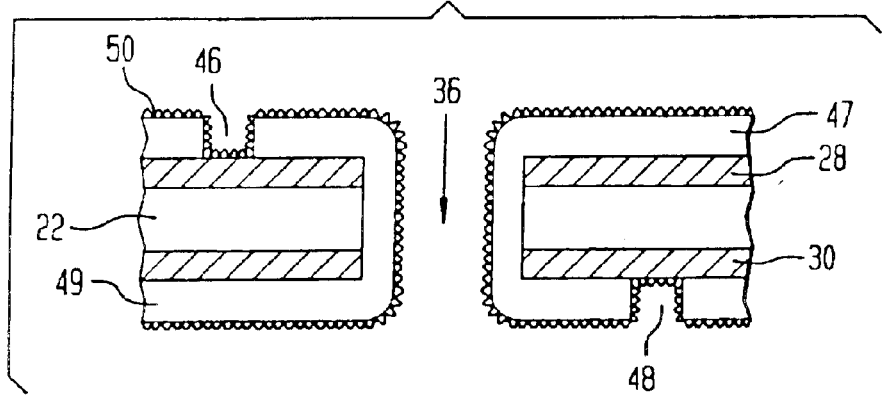

Referring to FIG. 6, in the next stage of the process, the first and second outer dielectric layers 47 and 49, the through vias 36 and the blind vias 46, 48, including the exposed regions of the first and second metal layers 28, 30 accessible through the closed ends of the blind vias 46, 48, are seeded with a conductive material 50 to provide a base for the formation of thicker outer metal layers thereover. Although the present invention is not limited by any particular theory, it is generally believed that a metal layer may not be reliably applied directly to dielectric material and therefore, the dielectric material is primed for receiving the outer metal layers by seeding the dielectric material with a conductive seed layer 50. The seed layer 50 typically comprises materials such as graphite. In other embodiments, the seeding technique may also include sputtering or electroless plating processes.

Figure 7:
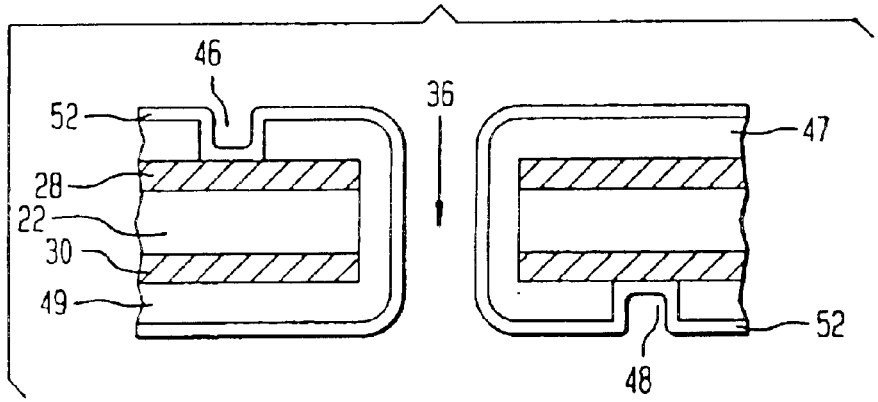

Referring to FIG. 7, outer metal layers 52, such as copper, are then deposited as a continuous layer over the conductive seed layer 50 and within the through vias 36 and the blind vias 46, 48 by using plating techniques. The plating technique may include electroless plating, electroplating or sputtering. Metals selected from the group consisting of gold, copper, tin, nickel and alloys or combinations thereof are preferred. Copper is particularly preferred where the outer metal layers 52 include only one metal. The outer metal layers 52 are preferably about 1 to 18 microns thick and most preferably between about 1 to about 6 microns thick.

Figure 8:
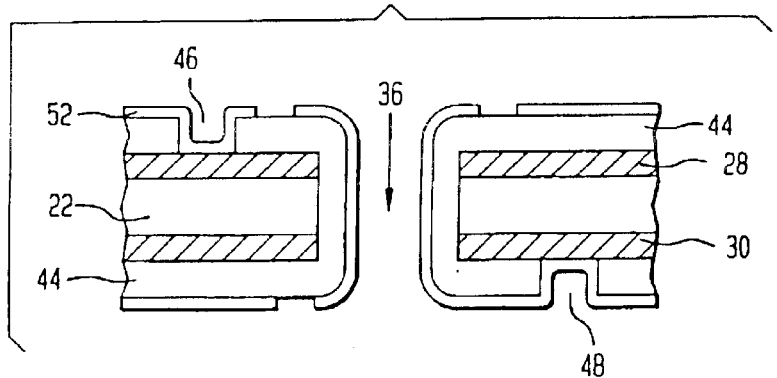
Figure 9:
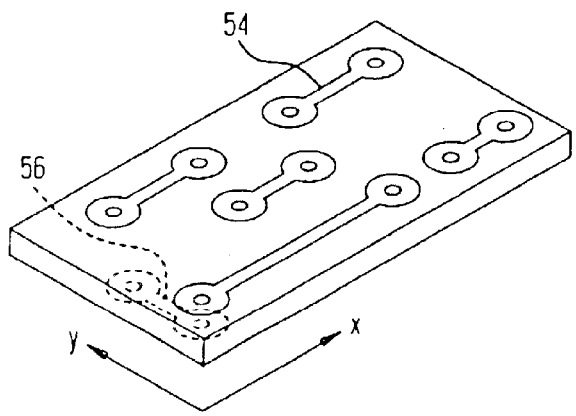
FIG. 9 is a perspective view of one embodiment of a multi-layer circuit element manufactured in accordance with the assembly steps shown in FIGS. 1–8.

Referring to FIGS. 8 and 9, the assembly may then be circuitized by selectively patterning the outer metal layers to form first signal lines 54 overlying the first metal layer 28 and second signal lines 56 overlying the second metal layer 30. The signal lines may be formed by using standard photoresist and etching techniques. In one embodiment, the first signal lines 54 are substantially parallel to one another and run in the direction generally designated "X" while the second signal lines 56 are also substantially parallel to one another and run in the direction generally designated "Y". The first signal lines 54 and the second signal lines 56 are substantially perpendicular to one another. In other embodiments, the step of selectively patterning the outer metal layers includes selectively depositing the outer metal layers over the outer dielectric layers.

Figure 10:
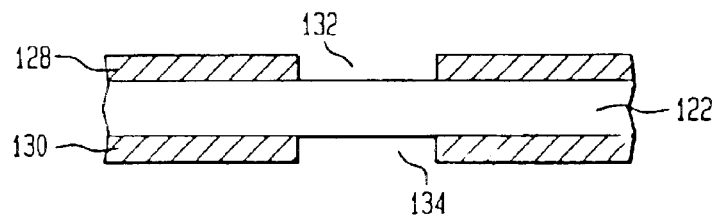
FIG. 10 is a fragmentary diagrammatic sectional view depicting portions of a multi-layer circuit assembly during one step of a fabrication process according to another embodiment of the invention.
Figure 11:
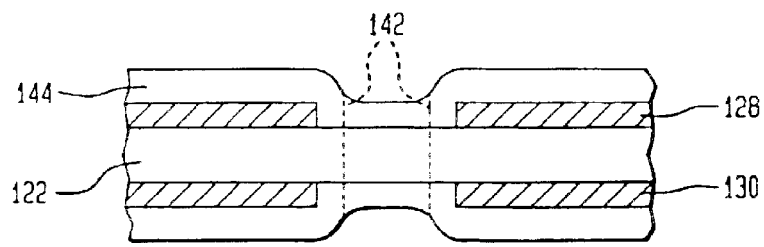
FIG. 11 is a view similar to FIG. 10 but depicting the multi-layer circuit assembly during later stages of the same process.

Referring to FIGS. 10 and 11, in a method of forming a multilayer assembly according to another embodiment, an inner dielectric element 122, substantially similar to that described above, is provided and first and second metal layers 128, 130 having openings therein are laminated to opposite sides of the dielectric element 122. The openings 132, 134 in the first and second metal layers 128, 130 are aligned so that each pair of openings 132, 134 are in substantial alignment. Next, the inner dielectric element and the first and second metal layers 128, 130 are coated with a dielectric material 144, according to processes as described above. Through vias (defined by imaginary lines 142) are then formed through the coated structure using the techniques described above to provide a partially finished assembly substantially similar to that shown in FIG. 4. The assembly is then completed using processes similar to those described above and shown in FIGS. 5–8.

Numerous variations and combinations of the features described above can be utilized without departing from the present invention as defined by the claims. In one such variant, the core structure may be assembled by laminating sheet metal to the exposed surfaces of the inner dielectric element. In other embodiments, the outer metal layers may be provided by laminating sheet metal over the outer dielectric layers after the coating step. In the latter embodiment, after the outer metal layer has been formed over the outer dielectric layers, the outer metal layer is subjected to a laser drilling process to form the blind vias and the assembly is then subjected to a plating process to provide a second outer metal layer in the blind vias and over the exposed regions of the first and second metal layers accessible through the blind vias.

In other embodiments, additional signal lines may be formed on the first and second metal layers. The additional signal lines may be etched into either of the first or second metal layers and then insulated with a dielectric material. The additional signal lines may be used for critical signal paths so the signals can be routed through the assembly using the shortest possible path and to avoid interference from other signal lines. Typically, in the final assembly, the first metal layer will act as a ground plane and the second metal layer will act as a power plane. However, in other preferred embodiments the first metal layer may be the ground plane and the second metal layer may be the power plane. Alternatively, both metal layers may be power planes or both may be ground planes. Further, either the first or second metal layers may act as both a power plane and a ground plane.

Although the foregoing techniques provide economical methods of making a multi-layer circuit assembly which has four layers, the same processes may be used to form assemblies having a different number of layers. For example, to provide a circuit assembly with numerous layers, several of the assemblies described above can be laminated together using such lamination techniques as disclosed in commonly assigned U.S. Patent As these and other variations and combinations of the features discussed above can be utilized without departing from the present invention, the foregoing description of the preferred embodiments should be taken by way of illustration, rather than by way of limitation of the invention described in the claims.

We claim:

1. A method of making a multi-layer circuit assembly comprising the steps of:
    (a) providing a core structure including an inner dielectric element having first and second metal layers on opposite surfaces thereof;
    (b) forming one or more through vias extending through said metal layers and said inner dielectric element;
    (c) coating said metal layers and said through vias with a dielectric material to thereby form a coated structure having first and second outer dielectric layers overlying the first and second metal layers respectively and dielectric material lining said through vias;
    (d) providing outer metal layers over said first and second outer dielectric layers;
    (e) metallizing said coated through vias to form metallic via liners connecting said outer metal layers and insulated from said first and second metal layers; and
    (f) patterning said outer metal layers such that at least some of said metallic via liners are electrically isolated from said first and second metal layers, wherein said patterning of said outer metal layers forms first signal lines overlying and substantially parallel to the plane of said first metal layer and second signal lines overlying and substantially parallel to the plane of said second metal layer.

2. A method as claimed in claim 1, wherein said first metal layer includes a ground plane and said second metal layer includes a power plane.

3. The method as claimed in claim 1, wherein said first signal lines are substantially perpendicular to said second signal lines.

4. The method as claimed in claim 1, further comprising the steps of forming blind vias through said outer dielectric layers to expose one or more regions of said first and second metal layers and metallizing said blind vias so that at least some of said first and second signal lines are connected to said first and second metal layers.

5. The method as claimed in claim 4, wherein said steps of metallizing said blind vias and metallizing said through vias are performed simultaneously.

6. The method as claimed in claim 1, further comprising the step of forming additional signal lines in at least one of said first and second metal layers before the coating step.

7. The method as claimed in claim 1, wherein each said through via has side walls, said side walls being covered by said dielectric material during the coating step.

8. The method as claimed in claim 1, wherein said patterning includes selectively removing portions of said outer metal layers.

9. The method as claimed in claim 8 wherein said portions of said outer metal layers are selectively removed by etching.

10. The method as claimed in claim 4, wherein the step of providing outer metal layers over said first and second outer dielectric layers includes the step of:
   depositing a seed layer over said outer dielectric layers including the blind vias and the exposed regions of said first and second metal layers;
   plating or sputtering a metal onto said seed layer.

11. The method as claimed in claim 1, wherein said outer metal layers are patterned by a step including selectively depositing said outer metal layers over said outer dielectric layers.

12. The method as claimed in claim 4, wherein the step of forming said blind vias includes the step of laser drilling said outer dielectric layers.

13. The method as claimed in claim 12, further comprising the step of plasma etching said blind vias after the laser drilling step to remove dielectric material residue remaining in said blind vias.

14. The method as claimed in claim 1, wherein during the coating step said dielectric material is provided having a uniform thickness.

15. The method as claimed in claim 1, wherein after the coating step said dielectric material has a uniform thickness of approximately 25–75 microns.

16. The method as claimed in claim 1, wherein after the coating step said through vias remain open.

17. The method as claimed in claim 1, wherein said through vias have a diameter of approximately 175–200 microns before the coating step and approximately 25–150 microns after the coating step.

18. The method as claimed in claim 1, wherein the coating step includes the step of electrophoretically depositing said dielectric material.

19. A method as claimed in claim 1, wherein the coating step includes the step of dipping said core structure in said dielectric material.

20. A method as claimed in claim 1, wherein the coating step includes the step of spin coating said core structure with said dielectric material.

21. The method as claimed in claim 1, wherein the step of forming said through vias includes the steps of etching said first and second metal layers and drilling said inner dielectric element.

22. A method as claimed in claim 1, wherein the step of forming said through vias includes punching said first and second metal layers and said inner dielectric element.

23. A method as claimed in claim 1, wherein the step of forming said through vias includes the step of plasma etching.

24. The method as claimed in claim 1, wherein the step of forming said through vias includes the steps of:
   etching said first and second metal layers to provide aligned openings therein;
   aligning a laser in one of said aligned openings and drilling said inner dielectric element.

25. The method as claimed in claim 1, wherein said first and second metal layers are approximately 1–18 microns thick.

26. The method as claimed in claim 1, wherein said inner dielectric element is approximately 25–50 microns thick.

* * * * *

UNITED STATES PATENT AND TRADEMARK OFFICE
CERTIFICATE OF CORRECTION

PATENT NO. : 6,820,330 B1  
DATED : November 23, 2004  
INVENTOR(S) : Belgacem Haba Page 1 of 1

It is certified that error appears in the above-identified patent and that said Letters Patent is hereby corrected as shown below:

Column 1,  
Line 62, after "about", delete "are".  
Line 62, after "18" insert -- microns --.

Column 2,  
Line 9, "well know" should read -- well-known --.  
Line 9, "during" should read -- drilling --.

Column 3,  
Line 9, "nickellchrome" should read -- nickel/chrome --.  
Line 15, after "overlying" delete ",".

Column 4,  
Line 15, after "reference" insert -- . --.  
Lines 46-52, should read -- In other embodiments, additional signal lines may be formed in at least one of the first and second metal layers before the coating step. For example, signal paths for carrying critical signals may be etched into the first and second metal layers, and the signal paths insulated during the coating with a dielectric material step. --

Column 5,  
Line 39, "and-the" should read -- and the --.

Column 8,  
Line 31, after "Patent" insert -- No. 5,282,312, the disclosure of which is Incorporated herein by reference. --

Signed and Sealed this

Nineteenth Day of April, 2005

JON W. DUDAS  
*Director of the United States Patent and Trademark Office*